United States Patent [19]

Gutman et al.

[11] Patent Number: 4,603,321

[45] Date of Patent: Jul. 29, 1986

[54] ANALOG-TO-DIGITAL INTERFACE CIRCUIT FOR ELECTRONIC MUSICAL EQUIPMENT

[75] Inventors: Vincent J. Gutman, Villa Park; Richard M. Schultz, Oakwood Hills, both of Ill.

[73] Assignee: Detente, Co., Villa Park, Ill.

[21] Appl. No.: 692,792

[22] Filed: Jan. 17, 1985

[51] Int. Cl.[4] .............................................. H03M 1/00

[52] U.S. Cl. ........................ 340/347 R; 340/347 AD; 84/1.01

[58] Field of Search .................... 340/347 AD, 347 R; 84/1.01, 1.19, 1.26

[56] References Cited

U.S. PATENT DOCUMENTS

| | | | |
|---|---|---|---|
| 3,815,124 | 6/1974 | Brewer | 340/347 AD |
| 4,091,379 | 5/1978 | Wu et al. | 340/347 AD |
| 4,193,332 | 3/1980 | Richardson | 84/1.26 |
| 4,296,407 | 10/1981 | Minakuchi | 340/347 AD |
| 4,300,431 | 11/1981 | De Rocco | 84/1.01 |
| 4,316,401 | 2/1982 | Travel et al. | 84/1.01 |

OTHER PUBLICATIONS

Bernie Hutchins, "An Experimental Pitch Extractor and Envelope Follower," Musical Engineer's Handbook, 1975, pp. 3–4.

*Primary Examiner*—William M. Shoop, Jr.
*Assistant Examiner*—Sharon D. Logan
*Attorney, Agent, or Firm*—Neuman, Williams, Anderson & Olson

[57] ABSTRACT

An interface circuit for converting analog signals from a musical instrument and/or a microphone to digital pulse signals for use with electronic music synthesizers and the like includes an input amplifier for receiving analog signals from a musical instrument and/or a microphone. A precision rectifier is coupled to the input amplifier for generating full-wave rectified analog signals. A strictly digital output circuit is connected to the rectifier for generating a strictly digital pulse signal. A quasi-digital output circuit is connected to the rectifier for generating a quasi-digital pulse signal in synchronism with the strictly digital pulse signal. The digital pulse signal from the digital output circuit and the quasi-digital pulse signal from the quasi-digital output circuit are adapted to drive a music synthesizer.

16 Claims, 3 Drawing Figures

ANALOG-TO-DIGITAL INTERFACE CIRCUIT FOR ELECTRONIC MUSICAL EQUIPMENT

BACKGROUND OF THE INVENTION

1. Field of the Invention

This invention relates generally to electronic tone generation and processing and more particularly, it relates to an interface circuit for converting analog signals from a musical instrument and/or a microphone to digital pulse signals for use with electronic musical synthesizers and the like.

2. Description of the Prior Art

A prior art search directed to the subject matter of this application in the U.S. Patent and Trademark Office revealed the following U.S. Letters Patent:

| | |
|---|---|
| 3,476,861 | 4,280,387 |
| 4,117,757 | 4,300,431 |
| 4,151,775 | 4,316,401 |
| 4,193,332 | 4,351,216 |

As is generally known to those skilled in the electronic musical instrument art, electronic music synthesizers are used to create varied musical sounds by generating and processing various basic waveforms to provide a desired sound. The music synthesizer generally utilizes a musical instrument or a signal from a microphone to derive an input source. The output signals from the musical instrument or microphone are basically a time-varying analog waveform. On the other hand, most modern music synthesizers such as electronic keyboard instruments and the like are substantially digital in operation. In other words, these synthesizers utilize digital circuit components to receive the various input signal sources for generating and reconstructing the various and sundry sounds. Thus, the synthesizers generally require strictly digital pulse signals (which are either high or low signals) or "dynamic" or quasidigital pulse signals (which are digital pulse signals coupled with a time-varying amplitude signal).

Heretofore, there has been no reliable means to interface the analog output signals from musical instruments or a microphone in a simple manner with the music synthesizers requiring digital pulse signals. The present invention provides such an interface circuit for converting analog signals from a musical instrument and/or a microphone to digital pulse signals for use with electronic music synthesizers and the like. The output signals from the interface circuit provide both digital pulse signals as well as dynamic digital pulse signals in response to the time-varying analog input signals.

SUMMARY OF THE INVENTION

Accordingly, it is a general object of the present invention to provide an improved interface circuit for interconnecting electric musical instruments having analog outputs to other electronic musical equipment requiring strictly digital input signals or dynamic digital input signals.

It is an object of the present invention to provide an interface circuit for converting analog signals from a musical instrument and/or a microphone to digital pulse signals for use with electronic musical synthesizers and the like.

It is another object of the present invention to provide an interface circuit for generating both strictly digital pulse signals and dynamic digital pulse signals in synchronism with the strictly digital pulse signals.

It is still another object of the present invention to provide an interface circuit which includes a sensitivity control to prevent undesired multiple triggering.

It is still yet another object of the present invention to provide an interface circuit having a digital output circuit section and a quasi-digital output circuit section which is relatively simple and economical to manufacture and assemble.

In accordance with these aims and objectives, the present invention is concerned with the provision of an interface circuit for converting analog signals from a musical instrument and/or a microphone to digital pulse signals for use with electronic music synthesizers and the like which includes an input amplifier for receiving analog signals from a musical instrument and/or a microphone. A rectifier is coupled to the input amplifier for generating full-wave rectified analog signals. A comparator is coupled to the rectifier for generating a digital pulse signal when a predetermined threshold voltage value has been exceeded. An envelope generator is coupled to the comparator for generating an envelope pulse. An envelope control circuit is connected to the envelope generator for setting the duration of the envelope pulse so as to prevent undesired multiple triggering. A pulse width circuit is connected to the envelope generator for setting the duration of the digital pulse signal. A digital output device is connected to the pulse width circuit for controlling the amplitude of the digital pulse signal. A peak detector circuit responsive to the rectifier and the pulse width circuit is provided for generating an analog peak signal. A gating circuit responsive to the analog peak signal and the digital pulse signal is provided for generating a quasi-digital pulse signal in synchronism with the digital pulse signal. An analog output circuit is connected to the gating circuit for controlling the amplitude of the quasi-digital pulse signal. The digital pulse signal from the digital output device and the quasi-digital pulse signal from the analog output device are adapted to drive a music synthesizer.

BRIEF DESCRIPTION OF THE DRAWINGS

These and other objects and advantages of the present invention will become more fully apparent from the following detailed description when read in conjunction with the accompanying drawings with like reference numerals indicating the corresponding parts throughout, wherein.

DESCRIPTION OF THE PREFERRED EMBODIMENT

Figure 1:
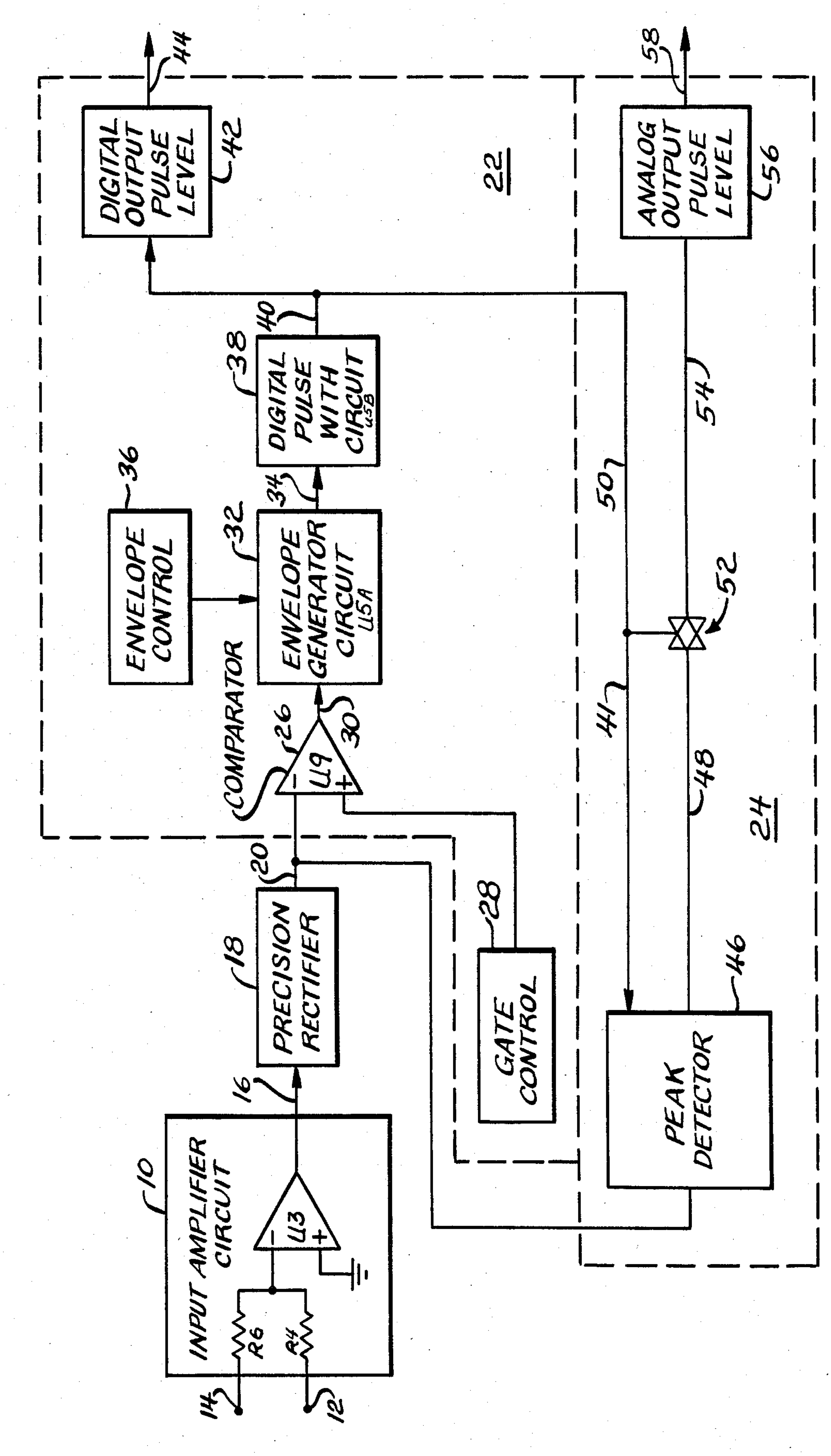
FIG. 1 is a block diagram of an interface circuit constructed in accordance with the principles of the present invention.
Figure 3:
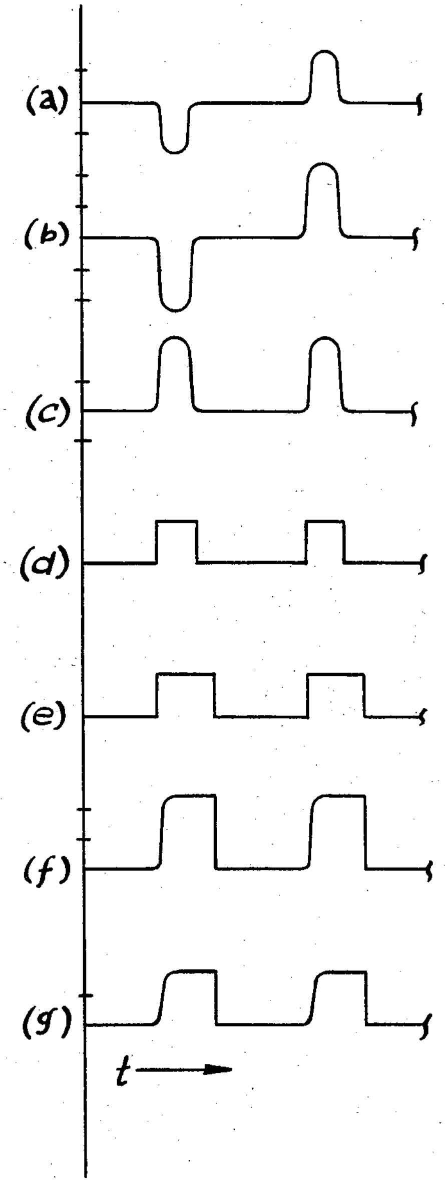
FIG. 3 (*a*) through 3(*g*) are waveform diagrams at various points useful in understanding the operation of the interface circuit of the present invention.

Referring now in detail to the various views of the drawings, there is shown in FIG. 1 in block diagram form an analog-to-digital interface circuit invention for use with electronic music equipment such as a music synthesizer. The interface circuit includes an input amplifier circuit 10 having input terminals 12 and 14 for receiving analog input signals derived from tone sources. When the tone source is from a musical instrument, its analog input signal is applied to the input terminal 12 which accommodates a low gain. If the tone source is from a microphone, its analog input signal is applied to the input terminal 14 which accommodates a high gain. FIG. 3(*a*) illustrates a waveform of the input signal at the input terminal 12.

The input amplifier circuit 10 has a low pass filter which suppresses the higher frequencies appearing in the analog input signal as well as reduces the amount of noise so as to provide a reasonably well defined fundamental frequency and control amplitude. The output of the amplifier circuit 10 on line 16 is shown in FIG. 3(*b*). Further, the output of the amplifier circuit 10 is fed to a precision rectifier 18 which takes the analog input signals and rectifies it so that its output on line 20 is a positive signal at all times. The precision rectifier 18 comprises a full-wave rectifier so that the negative portion of the analog input signal is merely inverted to the positive amplitude side. The output signal from the precision rectifier on line 20 is depicted in FIG. 3(*c*). The rectified output signal is then passed to a strictly digital output pulse section 22 and a "dynamic" or quasi-digital output pulse section 24.

The strictly digital output pulse section 22 includes a comparator 26 which emits a digital output signal whenever the analog input signal exceeds a preselected threshold voltage value. The threshold value is selectively chosen by a gate control circuit 28. The output of the comparator 26 on line 30 is delivered to an envelope generator circuit 32 which emits an envelope pulse on line 34 when the comparator generates an output indicating its threshold has been exceeded. The duration of the digital pulse on line 34 is regulated by an envelope control circuit 36 which defines a sensitivity control. This circuit is retriggerable and this remains active as long as threshold excursions continue. FIG. 3(*d*) illustrates the waveform from the output of the envelope generator circuit 32 on the line 34. This output from the envelope generator circuit is further fed to a digital pulse width circuit 38 which sets the duration of the digital output pulse. This circuit is triggered by the leading edge of the envelope pulse. A first output on line 40 from the circuit 38 is connected to a digital output pulse or level circuit 42 which controls the amplitude of the digital output pulse. FIG. 3(*e*) depicts the waveform at the output from the circuit 42 on the line 44. Thus, the output on line 44 from the level circuit 42 is strictly a digital output pulse whose duration and amplitude is set by the input requirements of the music synthesizer and the like which is to be driven by the interface circuit.

The quasi-digital output pulse section 24 includes a peak detector circuit 46 which senses the highest peak in the analog output signals from the precision rectifier 18. FIG. 3(*f*) illustrates the output of the peak detector. The output on line 48 of the peak detector circuit 46 will provide a signal whose amplitude equals the largest magnitude of the rectified analog signal that has been sensed up to that time during the sampling period. The sampling period is determined by the digital output pulse signal from a second output of the digital pulse width circuit 38 on the line 50 which is fed to a control terminal of a transmission gate 52. The input to the transmission gate is from the output of the peak detector 46. The quasi-digital output pulse signal from the transmission gate 52 on line 54 will be in synchronism with the digital output pulse signal since it is used to gate or turn on and off the transmission gate. The output of the transmission gate is fed to an analog (quasi-digital) output pulse level circuit 56 which sets the relative magnitude of the analog output pulse signal on line 58. This analog output pulse signal is illustrated in FIG. 3(*g*).

Figure 2:
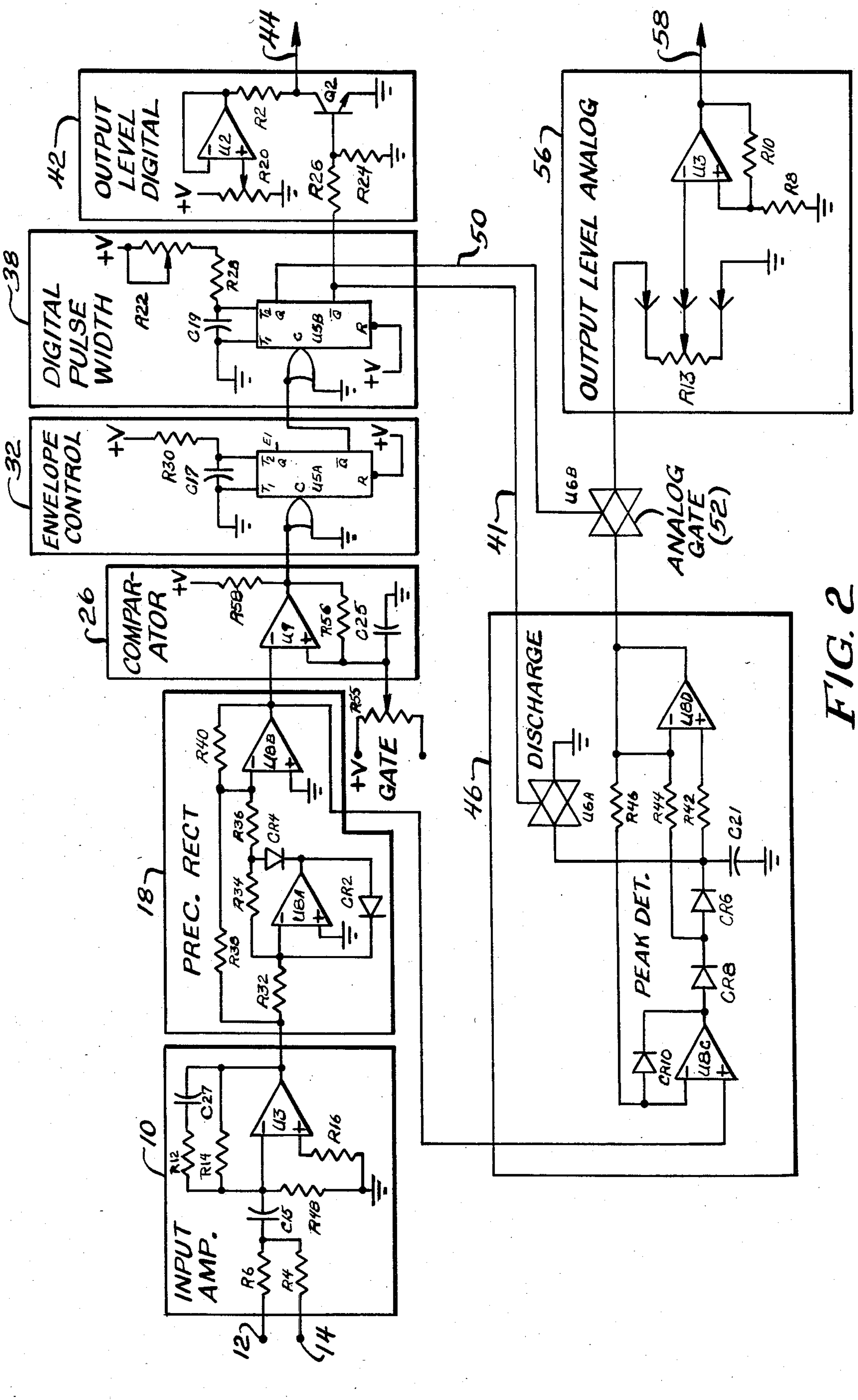
FIG. 2 a detailed schematic circuit diagram for the the interface circuit of FIG. 1.

While the various blocks of FIG. 1 of the drawing may take on various forms, a detailed schematic circuit diagram therefor is illustrated in FIG. 2. Even though the schematic circuit diagram is believed to be self-explanatory to those skilled in the art in view of the foregoing description, a brief description of the circuit components and their operation is believed to be in order.

The input amplifier circuit 10 is formed of an operational amplifier U3 and has gain-setting resistors R4, and R6. The analog input signal (whose waveform is shown in FIG. 3(*a*)) from a musical instrument such as a drum pad is fed through the low gain resistor R4 via the input terminal 14. When the analog input signal is from a microphone, it is fed through the high gain resistor R6 via the input terminal 12. The low pass filter is formed of capacitors C15, C27 and resistors R12, R18 which suppresses the higher frequencies from the analog input signal so as to round out slightly the waveform and to reduce the noise level. This filtered signal from the amplifier U3 is shown in FIG. 3(*b*) and is delivered to the precision rectifier circuit 18.

The precision rectifier circuit 18 is formed of operational amplifiers U8A, U8B; diodes CR2, CR4; and resistors R32, R34, R36, R38 and R40. The positive portions of the analog input signal are applied through the circuit components associated with both operational amplifiers U8A, U8B. On the other hand, the negative portions are applied only through the circuit components associated with the operational amplifier U8B. The output of the precision rectifier circuit 18 is a totally positive waveform as can be seen from FIG. 3(*c*) which is connected to the inverting input of the comparator circuit 26. The comparator circuit consists of an operational amplifier U9; capacitor C25; and resistors R56, R58. The comparator circuit provides an output signal when the analog input signal exceeds a prdetermined threshold voltage value. This threshold voltage value is set by the gate control circuit 28 which consists of a potentiometer R55. The wiper arm of the potentiometer R55 is connected to the non-inverting input of the comparator U9. The output of the comparator circuit is coupled to the input of the envelope generator circuit 32 which is formed of a one-shot or monostable multivibrator U5A for generating the envelope pulse. The clock input of the multivibrator U5A is driven by an OR gate having its one input receiving the signal from the comparator circuit. This envelope pulse signal is shown in FIG. 3(*d*) of the drawings. The duration of the envelope pulse is determined by the envelope control circuit 36 consisting of a resistor R30 and capacitor C17. The voltage across the capacitor C17 is applied across a terminal T1 and T2 of the multivibrator U5A for setting a long or short envelope pulse. Generally, a short envelope pulse is set for vocal input signals and a long envelope pulse is set for bass input signals. If the signal to the comparator circuit is a single, wide pulse which is "bumpy" and barely exceeds the threshold detection level, there would be detected by the comparator circuit a multiple successive peaks. In order to prevent undesired multiple triggering or make the envelope generator circuit substantially insensitive to such spurious peaks, the envelope control circuit is designed to generate an envelope pulse which is retriggerable and therefor longer than the duration of the expected input pulse signal. Thus, the successive peaks identified by the comparator circuit will not cause the multivibrator U5A to generate additional envelope pulses.

The output of the multivibrator U5A is fed to the digital pulse width circuit 40 consisting of another monostable multivibrator U5B which determines the duration of the digital output pulse. This is accomplished by a potentiometer R22, resistor R28 and capacitor C19. The voltage across the capacitor C19 is applied to terminals T1 and T2 of the multivibrator U5B. The output of the multivibrator U5B is connected to the digital output pulse level circuit 42 which is formed of a transistor Q2; operational amplifier U2; resistors R2, R24, R26; and a potentiometer R20. The potentiometer R20 is used to vary the amplitude of the digital output pulse on the line 44. The waveform from the level circuit 42 is shown in FIG. 3(*e*). As can be seen, there is one pulse corresponding to each input signal.

The peak detector circuit 46 is formed of operational amplifiers U8C, U8D; diodes CR6, CR8, CR10; capacitor C21; resistors R42, R44, R46; and transmission gate U6A. The output of the precision rectifier 18 is coupled to the non-inverting input of the operational amplifier U8C. The output from the multivibrator U5B on line 41 is fed to a control terminal of the transmission gate U6A for discharging the capacitor C21. The output of the peak detector circuit 46 is shown in FIG. 3(*f*) which is applied to the transmission gate 52(U6B). The output on the line 50 of the multivibrator U5B is fed to the control terminal of the transmission gate U6B for turning it on and off. As a result, the output of the transmission gate U6B is in synchronism with the digital output pulse on the line 40 from the multivibrator U5B. The output of the transmission gate U6B on line 54 is delivered to the analog (quasi-digital) output pulse level circuit 56 formed of an operational amplifier U3; resistors R8, R10; and potentiometer R13. The potentiometer R13 is used to vary the amplitude of the quasi-digital output pulse signal on the line 58. This quasi-digital output signal is shown in FIG. 3(*g*) of the drawings. As can be seen, this quasi-digital output pulse signal has an amplitude which is proportional to the output pulse amplitude from the peak detector circuit 46.

From the foregoing detailed description, it can thus be seen that the present invention provides an improved interface circuit for converting analog signals from a musical instrument and/or a microphone to digital pulse signals for use with electronic musical synthesizers and the like. The interface circuit provides both strictly digital pulse signals and dynamic digital pulse signals in synchronism with the strictly digital pulse signals for driving the musical synthesizer. Further, the interface circuit includes an envelope control circuit for setting the duration of the envelope pulse so as to prevent undesired multiple triggering.

While there has been illustrated and described what is at present to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. An interface circuit for converting analog signals from a musical instrument and/or a microphone to digital pulse signals for use with electronic music synthesizers and the like comprising:

input amplifier means for receiving analog signals from a musical instrument and/or a microphone;

rectifier means coupled to said input amplifier means for generating full-wave rectified analog signals;

digital output circuit means responsive to said rectifier means for generating a strictly digital pulse signal;

quasi-digital output circuit means responsive to said rectifier means for generating a quasi-digital pulse signal; and said digital pulse signal from said digital output circuit means and said quasi-digital pulse signal from said quasi-digital output circuit means being adapted for driving a music synthesizer.

2. An interface circuit as claimed in claim 1, wherein said digital output circuit means comprises comparator means, envelope generator means, envelope control means, pulse width means, and digital output means.

3. An interface circuit as claimed in claim 1, wherein said quasi-digital output circuit means comprises peak detector means, gating means and analog output means.

4. An interface circuit for converting analog signals to digital pulse signals for use with electronic musical synthesizers comprising:

input means for receiving analog signals for conversion;

rectifier means coupled to said input means for full wave rectification of said analog signal;

means coupled to said rectifier means for producing a pulse of selected duration in response to predetermined signal threshold characteristics in said rectified signal;

peak detector means coupled to said rectifier means and responsive to said rectified signal to produce a peak value signal corresponding to the peak value of said rectified signal; and means for controlling said peak detector means in response to said pulse, whereby said pulse and a synchronized, corresponding peak value are generated for use with electronic music synthesizers.

5. The interface circuit of claim 4 further including:

digital output pulse level means for selectively adjusting the amplitude of said pulse for output.

6. The interface circuit of claim 4 further including:

analog output pulse level means for selectively adjusting the amplitude of said synchronized, peak value signal for output.

7. The interface circuit of claim 4 wherein said pulse means comprises:

comparator means coupled to receive said rectified signal and a predetermined control signal, for detecting when said rectified signal exceeds said control signal; and pulse generator means responsive to said detection for generating a pulse of selected duration.

8. The interface circuit of claim 4 wherein said means for controlling said peak detector means comprises gating means responsive to said pulse for enabling said peak detector means during said selected pulse duration.

9. The interface circuit of claim 4 wherein said input means includes an operational amplifier having a predetermined low pass filter for suppressing undesired higher frequency signals in said analog input signal.

10. The interface circuit of claim 4 wherein said rectifier means comprises a precision rectifier.

11. The interface circuit of claim 4 wherein said comparator means comprises an operational amplifier having its inverting input connected to the output of said rectifier means and its non-inverting input connected to a potentiometer for providing said predetermined control signal.

12. The interface circuit of claim 7, wherein said pulse generator means includes a first monostable multivibrator for providing a first pulse signal of a controlled duration, whereby said pulse generator means may be rendered substantially insensitive to spurious peak transitions in said input signal.

13. The interface circuit of claim 12 wherein said pulse generator means includes a second monostable multivibrator responsive to the output of said first monostable multivibrator for generating a digital pulse of selectable duration.

14. The interface circuit of claim 5 wherein said digital output pulse level means comprises an operational amplifier.

15. The interface circuit of claim 8 wherein said gating means comprises:

first transmission gate operable to enable said peak detector in response to initiation of said pulse; and a second transmission gate operable to allow transmission of said peak value signal during said pulse duration.

16. The interface circuit of claim 6 wherein said analog output pulse level means comprises an operational amplifier.

* * * * *